United States Patent [19]

Hayashi et al.

[11] 3,923,553

[45] Dec. 2, 1975

[54] METHOD OF MANUFACTURING LATERAL OR FIELD-EFFECT TRANSISTORS

[75] Inventors: Yutaka Hayashi, Hoya; Yasuo Tarui, Tokyo, both of Japan

[73] Assignee: Kogyo Gijutsuin, Japan

[22] Filed: Dec. 7, 1973

[21] Appl. No.: 422,881

Related U.S. Application Data

[60] Division of Ser. No. 268,004, June 30, 1972, abandoned, which is a continuation-in-part of Ser. No. 62,838, Aug. 11, 1970, abandoned.

[30] Foreign Application Priority Data

| | | |
|---|---|---|
| Oct. 14, 1969 | Japan | 44-81743 |
| Nov. 20, 1969 | Japan | 44-92511 |
| Nov. 20, 1969 | Japan | 44-92512 |

[52] U.S. Cl. .................. 148/1.5; 148/187

[51] Int. Cl.[2] .................. H01L 21/00; H01L 7/44

[58] Field of Search .................. 148/1.5, 187

[56] References Cited

UNITED STATES PATENTS

| | | | |
|---|---|---|---|
| 3,513,042 | 5/1970 | Hagon | 148/187 |
| 3,594,241 | 7/1971 | Bresee | 148/187 |
| 3,595,716 | 7/1971 | Kerr | 148/1.5 |
| 3,634,204 | 1/1972 | Dhaka | 148/187 |

*Primary Examiner*—Peter D. Rosenberg
*Attorney, Agent, or Firm*—Robert E. Burns; Emmanuel J. Lobato; Bruce L. Adams

[57] ABSTRACT

In a field-effect transistor (hereinafter referred to as FET) and a lateral transistor in which its effective base width is determined by diffusion distances of impurities or a difference of diffusion distances due to impurities, a base region is made to be continuous with a region formed by another process step and having an impurity of the same conductivity type as that of the base region, or is overlapped by a region having an impurity of opposite conductivity type to that of the base region.

Furthermore, modifications adapted for integrated circuits of aforementioned FET and methods of manufacturing them are disclosed.

6 Claims, 16 Drawing Figures

METHOD OF MANUFACTURING LATERAL OR FIELD-EFFECT TRANSISTORS

BACKGROUND OF THE INVENTION

This is a division of application Ser. No. 268,004, filed June 30, 1972, and now abandoned, which is a continuation-in-part application of application Ser. No. 62,838, filed Aug. 11, 1970, and now abandoned.

The present invention relates to improvements of a FET and a lateral transistor for integrated circuits and to the methods of manufacturing the same.

Heretofore, there have been various super-high frequency FET's in which their short channel lengths are determined by diffusion distances. Since, in these kinds of transistors, a semiconductor substrate becomes a drain region, it is necessary to adopt a step of isolating the drain region from other regions to obtain a semiconductor structure adapted for integrated circuits. Accordingly, steps of manufacturing a FET described above become complicated and a capacitance between the drain and ground becomes large, and consequently various deficiencies are caused in operational characteristics, especially in speed characteristics. To resolve these problems, it is preferable to effect isolation of drain region, simultaneously with other manufacturing steps of the transistor with a view toward reducing the number of manufacturing steps, while it is necessary to reduce a capacitance between the drain and ground by decreasing the area of the drain region to improve the high-frequency characteristics.

Moreover, in a FET in which a region in which a channel is to be formed, that is, a main operational region is formed by means of a diffusion process, an excellent high-frequency characteristics can be obtained, because it is extremely easy to shorten the channel length. However, there have been many problems to be resolved in view of the formation of structure in integrated circuits.

Also, in a FET in which its channel length is determined by a difference between the diffusion distances due to impurities, a channel length less than 1 $\mu$ and the resultant excellent high-frequency characteristics can be obtained, while a semiconductor structure in which the whole area of the base region on the surface of the semiconductor is utilized as a channel of transistor is unfit for fabricating four-electrode FET or for making lead contacts of electrodes.

SUMMARY OF THE INVENTION

Therefore, it is an object of the invention to provide a method of manufacturing an excellent FET and a lateral transistor adapted for integrated circuits which can be produced by a small number of process steps.

It is another object of the invention to provide a method of carrying out easily drain-isolation or collector isolation adapted for integrated circuits and more particularly to provide an improved method of producing a FET wherein fabrication of the FET and isolation of its drain region are simultaneously carried out.

It is a further object of the invention to provide a method of manufacturing a FET or a lateral transistor in which its drain or collector region is very small and its drain capacitance between the drain and ground is small also, and which has excellent high frequency characteristics.

It is another object of the invention to provide a method of manufacturing a FEt in which its channel length is determined by a difference between diffusion length of impurities and a dual gate structure can be easily obtained.

It is still another object of the invention to provide a method of manufacturing a FET adapted for integrated circuits which has excellent high-speed characteristics and static characteristics without causing any lowering of element density due to isolated drain layer.

Characteristic features, principles, functions and utility of the invention will be more clearly apparent from the following detailed description in connection with the accompanying drawings, in which like parts are designated by like reference numerals and characters.

DETAILED DESCRIPTION OF THE INVENTION

The organization and performance of a FET made according to the invention may be described with reference to the accompanying drawings. It will be understood by one skilled in the art that the methods according to the present invention are also applicable to the fabrication of lateral bipolar transistors. In this case the insulated gate electrode of the FET would be replaced by a base electrode in conductive contact with the base region of the lateral bipolar transistor.

Figure 1:
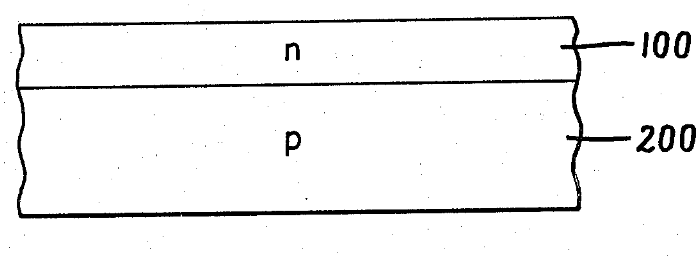
FIGS. 1 through 4 are similar sectional views respectively indicating structure of a FET in successive steps of one example of the invention.
Figure 2:
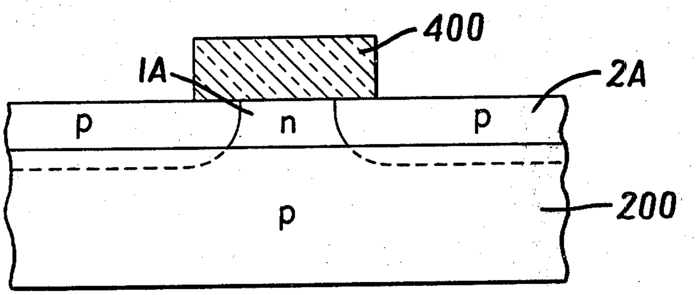

In one example as illustrated in FIGS. 1 through 4, there is shown a channel type FET, wherein an n type thin semiconductor crystal layer 100 is formed on a p type semiconductor crystal region 200 by epitaxial growth or diffusion. As illustrated in FIG. 2, a diffusion mask 400 is prepared on the surface of the n type crystal layer 100 shown in FIG. 1 and a base region 2A in which a channel is to be formed on the surface of the semiconductor is formed by a diffusion process. The forementioned diffusion is carried out in such a manner that a diffused region reaches a p type crystal region 200 through the n type crystal layer 100 as shown by a broken line, whereby a p type region 2A is formed on the diffused portion and a region 1A in which a drain region is to be formed is formed on a portion covered with the diffusion mask 400.

Figure 3:
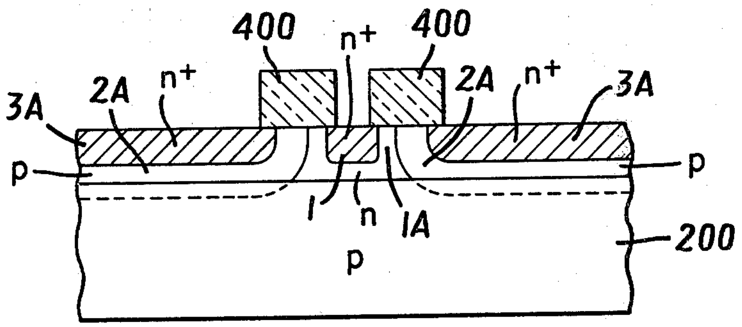

Next, as illustrated in FIG. 3, a window is opened in the diffusion mask 400, through which the region 1A in which the drain region is to be formed is diffused to form a region 1 of low resistivity. In this case, a diffusion of the source region 3A is effected by utilizing an identical diffusion mask as that utilized in the diffusion of the base region 2A.

Figure 4:
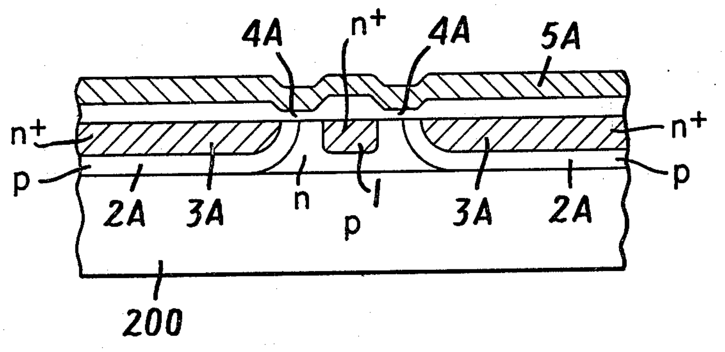

Thereafter, as shown in FIG. 4, a portion of insulating film 400 utilized as diffusion mask is removed, a gate-insulating film 4A is formed on the whole surface of the region 1 of low resistivity, the drain region 1A, the base region 2A and the source region 3A, and a gate-electrode 5A is attached thereon, thereby to manufacture a FET of which sectional structure is shown in FIG. 4. Thus, as is apparent from the foregoing description, in a FET made by the process according to the invention the source and drain regions are naturally isolated from the substrate 200 simultaneously with production a transistor, so that their isolation step can be omitted and consequently an integrated circuit structure can be obtained easily.

Now, assuming that the substrate made of an n-p type structure in the example described above is substituted for that made of an n-p-n type structure, not only source and drain region, but also the base region can be isolated by diffusion of the n-type impurity. And it is apparent that a p channel FET is similarly applicable, if only an n type in the example described above is substituted for p type. Also, of course, impurities can be introduced into the semiconductor substrate by ion implantation, and furthermore the method described above is also applicable to a lateral transistor.

Figure 5:
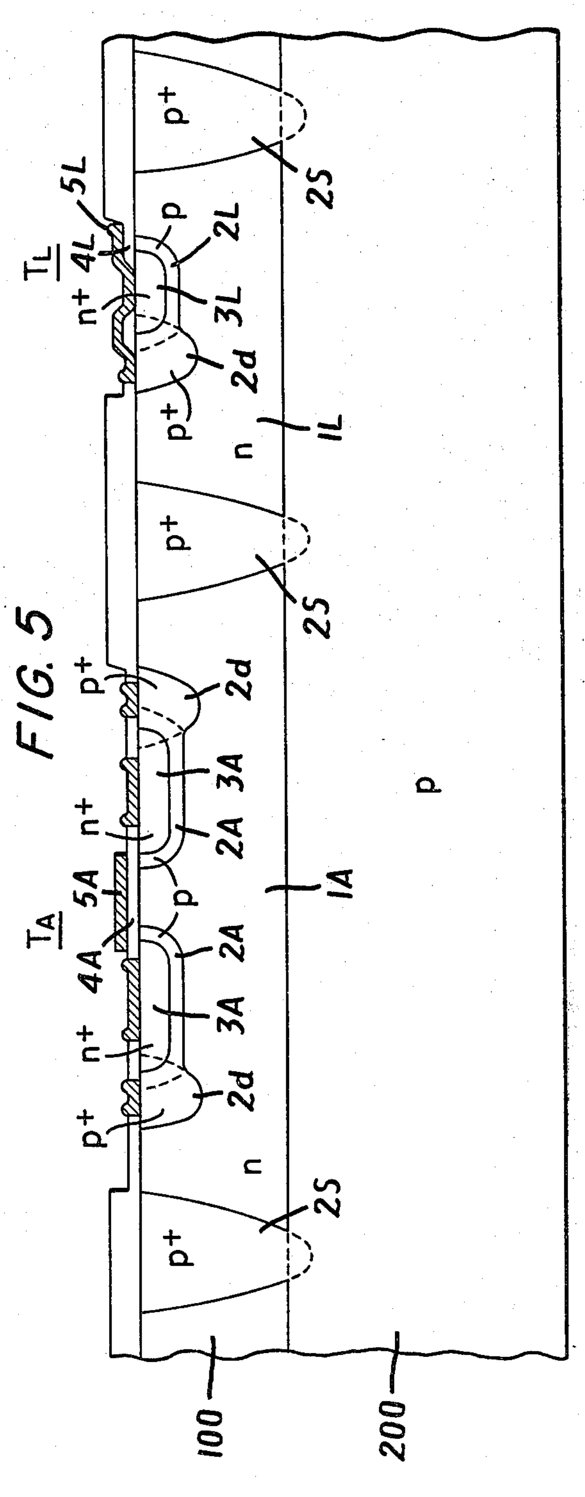
FIG. 5 is a similar sectional view of the conventional FET built in an integrated circuit structure.

As conducive to a full understanding of another aspect of the invention, the essential functions and difficulties in the conventional FET built in an integrated circuit will be described in detail in connection with FIG. 5. In FIG. 5, a region 100 is formed on a substrate 200 by diffusion or epitaxial growth of a thin semiconductor of opposite conductivity type to that of the substrate 200. A base region 2L and a source region 3L are diffused into the semiconductor region 100 (used as a drain region) and an electrode 5L is formed through a gate insulating film 4L on the base region 2L, thereby to constitute a load transistor $T_L$. Similarly, a transistor for an active element comprising a drain region 1A, a base region 2A, a source region 3A, a gate insulating film 4A and an electrode 5A is produced across an isolation layer 2S. A region 2d represents a diffused region for a base contact. In an excellent integrated circuit in which the base region 2L of the load transistor $T_L$ as described above is isolated from the substrate 200, it is necessary to provide the isolation layer 2S capable of electrically separating a region to be isolated or a drain region from other portions of the integrated circuit structure, so that it is impossible to obtain a large element density. And the aforementioned structure gives rise to an increase in the peripheral area of the drain region 1A of the transistor $T_A$ used as an active element, resulting in increase in drain capacitance and deterioration in the high-frequency characteristics of the circuit.

Generally, the transistor $T_A$ for an active element is usually used in a common source configuration from the point of view of a small signal operation so that there is no trouble even if the potential of the base region and that of the substrate are equal.

Figure 6:
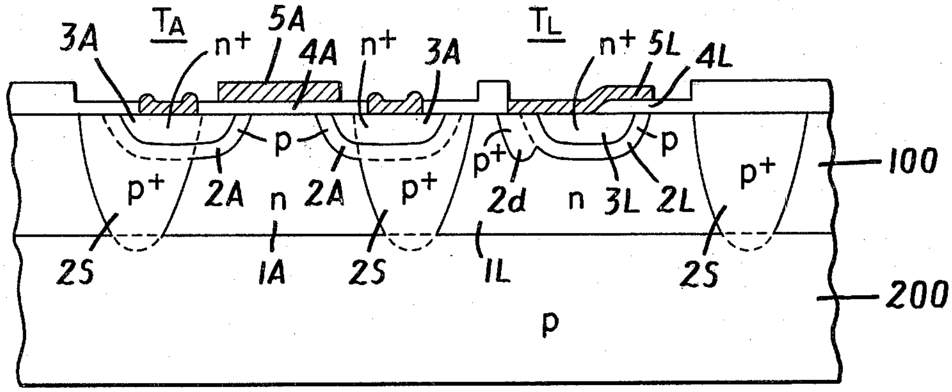
FIG. 6 is a similar sectional view of the integrated circuit structure in one example of the invention.

In order to increase the element density of the integrated circuit, in an example illustrated in FIG. 6, a portion of the isolation layer 2S may be positioned under the source region 3A. That is, in FIG. 6, there is provided such a structure that the isolation layer 2S of the transistor $T_A$ for the active element is moved to a diffused portion 2d for the base-contact in FIG. 5. In this case, although a potential of the base region 2A of the transistor $T_A$ for the active element becomes equal to that of the substrate 200, it does not give unfavorable effect to the circuit characteristics and a peripheral area of the drain region 1A is remarkably reduced as compared with the structure as shown in FIG. 5. The isolation layer 2S of the load transistor $T_L$ can be made common with the isolation layer 2S which is positioned under the source region 3A of the transistor $T_A$ for active element. Since, in such a load transistor in which the drain region is connected to the power supply, the drain region 1L of the load transistor $T_L$ is grounded from the point of view of a.c. operation, the area of the drain region, as shown in FIG. 6, may be large.

Figure 7A:
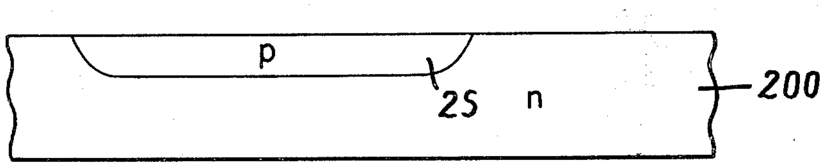
FIG. 7 (*a*) through 7 (*c*) are sectional views respectively indicating an integrated circuit structure in successive steps of another example of the invention.
Figure 7B:
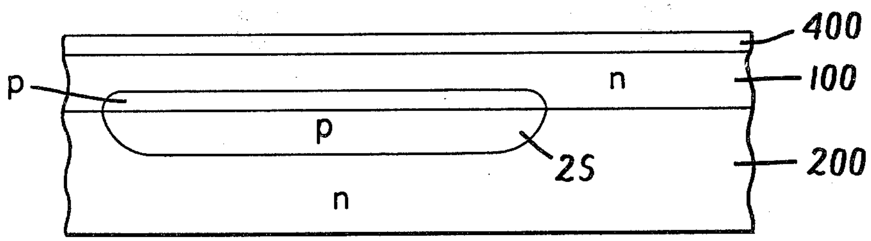
Figure 7C:
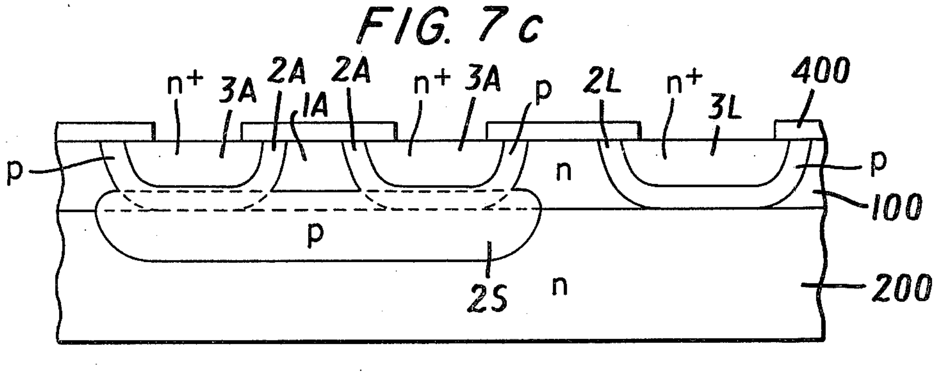
Figure 8A:
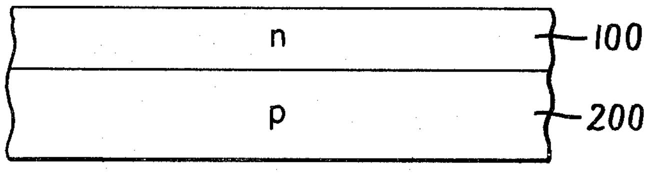
FIGS. 8 (*a*) through 8 (*e*) are similar sectional views respectively indicating structure of a FET in successive steps of another example of the invention and its equivalent circuit diagram.
Figure 8B:
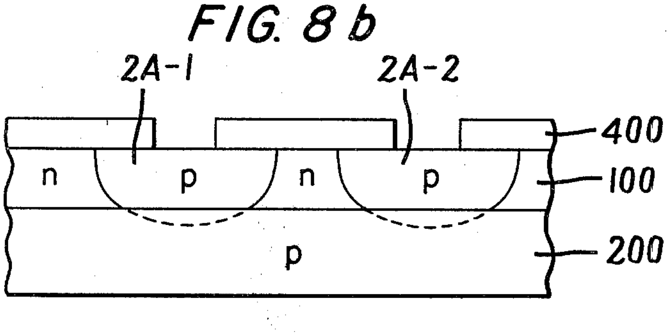
Figure 8C:
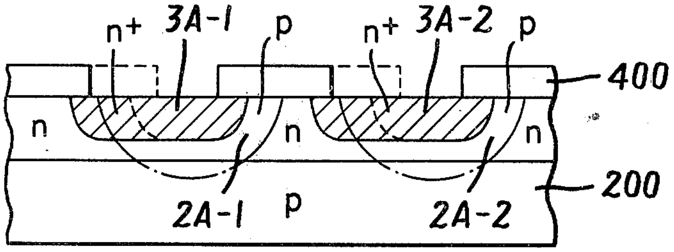
Figure 8D:
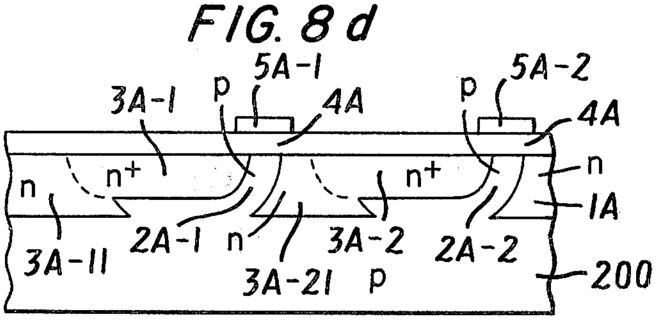
Figure 8E:
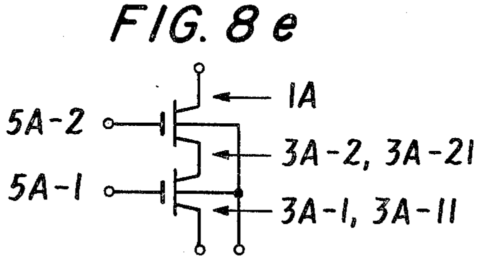

Next, another example, as illustrated in FIGS. 7 (*a*) through 7(*c*), of the method according to the invention, in which a base region 2A of the transistor $T_A$ for an active element is not grounded and a peripheral area of the drain region 1A is small, and which can be made of high-density and high-compact, will be described hereinafter. In FIGS. 7(*a*) through 7(*c*), a portion of the isolation layer 2S is similarly positioned between the source region 3A of the transistor $T_A$ for an active element and the substrate 200. First of all, the isolation layer 2S, as illustrated in FIG. 7(*a*), is formed into substrate 200 by selective diffusion or selective epitaxial growth. The isolation layer 2S is a semiconductor region of opposite conductivity type to that of the substrate 200. After, as shown in FIG. 7(*b*), a semiconductor region 100 of same conductivity type as that of the substrate 200 is formed thereon by epitaxial growth, an insulating film 400 for diffusion mask is attached thereon. Thereafter, as illustrated in FIG. 7(*c*), a window for diffusion is opened in the insulating film 400, through which two kinds of impurities are introduced by diffusion into the semiconductor region 100 to a depth that they reach the isolation layer 2S, thereby to form drain region 1A, main base region 2A, and source region 3A of the transistor $T_A$ for active element. Simultaneously with production of the transistor $T_A$ described above, base region 2L and source region 3L of the load transistor $T_L$ are similarly produced. Thereafter, processing steps of providing a gate insulating film and electrodes are carried out, to complete a FET for an integrated circuit structure. In this example, the substrate 200 is used in a manner wherein it is biased to a common source voltage for each of the load transistors. Moreover, the method in this example discribed above is applicable to a load transistor in which its base region is separated from other portions thereof.

Next, another example of the invention, as illustrated in FIGS. 8(*a*) through 8(*e*), will be described hereinafter. The transistor described here exhibits an excellent performance as an automatic gain controlling (AGC) element or a frequency-converting element in case when an input signal and a gain controlling voltage, or a signal of frequency for local oscillation and a signal to be detected are applied to each of two gate electrodes 5A-1 and 5A-2. In this case, it has a construction in which almost half the area of a region adjacent to the surface of the base region is shorted by introduction of an impurity of opposite conductivity type to that of the base region. In the example, as illustrated in FIGS. 8(*a*) through 8(*e*), n channel type FET is produced. First, a thin semiconductor layer 100 of n type, as shown in FIG. 8(*b*), is formed thereon by vapour growth, deposition or thermal oxidization. Next, a window for diffusion is opened in the insulating film 400, through which a p type impurity is diffused into the semiconductor layer 100 to a depth that it reaches the substrate 200, thereby to form a region containing regions 2A-1 and 2A-2 in the base region. As illustrated in FIG. 8(*c*), a portion of the windows for diffusion is selectively enlarged to short one side of the surface of the base region, thereafter n type impurity is diffused into the regions 2A-1 and 2A-2, and the semiconductor layer 100 therethrough. In FIG. 8(*c*), dotted lines in the insulating film 400 represent freshly removed portions and other dotted lines in n type diffused regions 3A-1 and 3A-2 as shown by oblique lines represent end portions of an n type diffused region which is diffused thereinto by utilizing the same diffusion mask as that as shown in FIG. 8(*b*). Finally, a portion of diffusion mask 400 is removed, subsequently a gate insulating film 4A is formed on the whole area of the diffused regions 3A-1 and 3A-2, base regions 2A-1 and 2A-2, regions 3A-11 and 3A-21, and region 1A by vapour growth, deposition or thermal oxidization, and gate electrodes 5A-1 and 5A-2 are formed thereon by evaporation, thereby to obtain an FET as illustrated in FIG. 8(*d*). In FIG. 8(*d*), numerals 3A-11, 3A-21 and 1A respectively represent a source region, an intermediate layer and a portion of drain region of the transistor, each of them being isolated from other portions of the semiconductor layer 100 on the substrate. FIG. 8(*e*) illustrates an equivalent circuit of the FET as shown in FIG. 8(*d*).

Figure 9B:
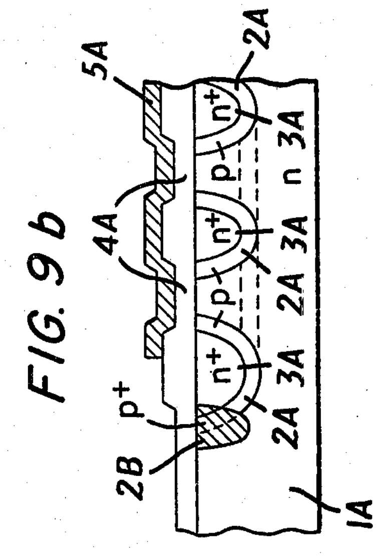
FIGS. 9 (*a*) and 9 (*b*) are a plan view and a sectional view of structure of a FET in still another example of the invention.
Figure 9A:
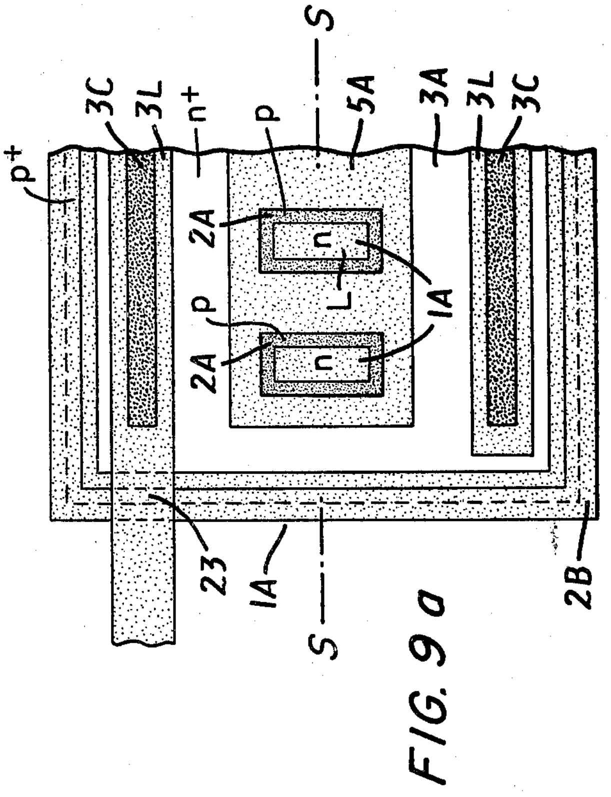

Moreover, an organization and effect of an FET, in another aspect of the invention, in which a capacitance between the gate and drain region, and a leakage current are extremely small, will be described hereinafter. FIG. 9(*b*) shows a sectional view along the line S—S in FIG. 9(*a*) which shows a part of an FET. Since, in the FET as illustrated in FIGS. 9(*a*) and 9(*b*), main portions 2A of the base region is formed in such a manner that p and n type impurities are respectively diffused by using an identical diffusion mask to form the base region 2A and source region 3A, a width L of the base region is determined by the difference of diffusion distances of two impurities, said width L corresponding to a channel length thereof. In a depletion type FET, in which transistor current flows between the drain region and the source region even when the voltage between a gate electrode 5A and a source region 3A is zero, a current flows from the outside portion into the source region 3A through a channel in the surface of the base region (a portion represented by the dotted line) also in case of lacking the diffused portion 2B. When, to compensate the current described above, a gate electrode is provided on a gate insulating film 4A, an area in which the gate electrode is to be provided should be larger by the amount of errors due to not only a dimension accuracy in the photoetching process, but also positioning accuracy. As a result, a superposing area between the drain region and gate electrode becomes larger than that between the drain region 1A and gate electrode 5A inside of the source region 3A, thereby to increase a capacitance between the drain region and gate electrode per unit gm (transfer conductance) and to the deteriorate frequency characteristics. Since, moreover, there is no gate electrode on a channel adjacent to a region 23 in which source-lead out electrode is taken out, a current always flows as if it is a leakage current between the drain and source, thereby to deteriorate frequency characteristics thereof.

On the other hand, assuming that, as illustrated in FIGS. 9(*a*) and 9(*b*), an impurity of the same conductivity type as that of the base region is diffused into a region 2B adjacent to a region outside of the source region 3A in such a manner as to provide a high enough surface concentration of impurity for a channel not to be formed when gate voltage is zero and a gate electrode to be provided on the region 2B becomes unnecessary and a channel is not formed on the region 23 under source leadout electrode, thus stopping a leakage current. Accordingly, an excellent FET, in which capacitance between the gate electrode and drain per unit gm is extremely small, can be easily obtained.

We claim:

1. A method of manufacturing a field-effect transistor having a semiconductor substrate with a drain region and a source region of the same conductivity type formed therein and a base region of an opposite conductivity type as said drain and source regions and disposed therebetween, comprising the steps of:

providing a semiconductor substrate having a first layer of a first conductivity type and an adjacent underlying second layer of a second conductivity type opposite said first conductivity type;

forming on said first layer a mask layer having a window therethrough surrounding a portion of said mask layer to expose an area of said first layer defined by said window;

selectively diffusing an impurity of said second conductivity type through said window and into said first layer to a sufficient depth to impart said second conductivity type to a region of said first layer extending to said second layer to define a drain region comprised of a region of said first layer isolated from the remainder of said first layer by said region having said second conductivity type imported thereto; and subsequently selectively diffusing an impurity of said first conductivity type through said window to impart said first conductivity type to a portion of said region having said second conductivity type imparted thereto to form a source region of said region having said first conductivity type, the remainder of said region having said second conductivity type imparted thereto defining a base region of said second conductivity type disposed between said drain region and said source region of said first conductivity type.

2. A method of manufacturing a field-effect transistor according to claim 1, further comprising:

removing said mask layer after subsequently diffusing an impurity of said first conductivity type through said window;

disposing an insulative layer over a portion of said substrate sufficient to cover said base region and portions of said source region and said drain region adjacent said base region; and forming a conductive electrode on at least a portion of said insulative layer overlying said base region.

3. A method of manufacturing a field-effect transistor according to claim 1, further comprising before subsequently diffusing an impurity of said first conductivity type, the step of removing a portion of said masking layer surrounded by said window to expose a portion of said drain region, and the step of subsequently diffusing an impurity of said first conductivity type through said window includes selectivity diffusing an impurity of said first conductivity type to the exposed portion of said drain region to increase the conductivity thereof.

4. A method of manufacturing a field-effect transistor having a semiconductor substrate with a drain region and a source region of the same conductivity type formed therein and a base region of an opposite conductivity type as said drain and source regions and disposed therebetween, comprising the steps of:

providing a semiconductor substrate having a first layer of a first conductivity type and an adjacent underlying second layer of a second conductivity type opposite said first conductivity type;

forming on said first layer a mask layer having a window therethrough surrounding a portion of said mask layer to expose an area of said first layer defined by said window;

selectively implanting and diffusing an impurity of said second conductivity type through said window and into said first layer to a sufficient depth to impart said second conductivity type to a region of said first layer extending to said second layer to define a drain region comprised of a region of said first layer isolated from the remainder of said first layer by said region having said second conductivity type imparted thereto; and subsequently selectively diffusing an impurity of said first conductivity type through said window to impart said first conductivity type to a portion of said region having said second conductivity type imparted thereto to form a source region of said first conductivity type, the remainder of said region having said second conductivity type imparted thereto defining a base region of said second conductivity type disposed between said drain region and said source region of said first conductivity type.

5. A method of manufacturing a lateral transistor having a semiconductor substrate with a collector region and an emitter region of the same conductivity type formed therein and a base region of an opposite conductivity type as said collector and emitter regions and disposed therebetween, comprising the steps of:

providing a semiconductor substrate having a first layer of a first conductivity type and an adjacent underlying second layer of a second conductivity type opposite said first conductivity type;

forming on said first layer a mask layer having a window therethrough surrounding a portion of said mask layer to expose an area of said first layer defined by said window;

selectively diffusing an impurity of said second conductivity type through said window and into said first layer to a sufficient depth to impart said second conductivity type to a region of said first layer extending to said second layer to define an emitter region comprised of a region of said first layer isolated from the remainder of said first layer by said region having said second conductivity type imparted thereto; and subsequently selectively diffusing an impurity of said first conductivity type through said window to impart said first conductivity type to a portion of said region having said second conductivity type imparted thereto to form a collector region of said first conductivity type, the remainder of said region having said second conductivity type imparted thereto defining a base region of said second conductivity type disposed between said emitter region and said collector region of said first conductivity type.

6. A method of manufacturing a lateral transistor having a semiconductor substrate with a collector region and an emitter region of the same conductivity type formed therein and a base region of an opposite conductivity type as said emitter and collector regions and disposed therebetween, comprising the steps of:

providing a semiconductor substrate having a first layer of a first conductivity type and an adjacent underlying second layer of a second conductivity type opposite said first conductivity type;

forming on said first layer a mask layer having a window therethrough surrounding a portion of said mask layer to expose an area of said first layer defined by said window;

selectively implanting and diffusing an impurity of said second conductivity type through said window and into said first layer to a sufficient depth to impart said second conductivity type to a region of said first layer extending to said second layer to define an emitter region comprised of a region of said first layer isolated from the remainder of said first layer by said region having said second conductivity type imparted thereto; and subsequently selectively diffusing an impurity of said first conductivity type through said window to impart said first conductivity type to a portion of said region having said second conductivity type imparted thereto to form a collector region of said first conductivity type, the remainder of said region having said second conductivity type imparted thereto defining a base region of said second conductivity type disposed between said emitter region and said collector region of said first conductivity type.

* * * * *